United States Patent
Costa et al.

(10) Patent No.: US 10,243,539 B2
(45) Date of Patent: Mar. 26, 2019

(54) RADIO FREQUENCY TRANSMIT FILTER WITH INTEGRATED IMPEDANCE MATCHING NETWORK

(71) Applicant: Resonant Inc., Santa Barbara, CA (US)

(72) Inventors: James R. Costa, Lompoc, CA (US); Neal Fenzi, Santa Barbara, CA (US); Robert Hammond, Santa Barbara, CA (US)

(73) Assignee: Resonant Inc., Santa Barbara, CA (US)

( * ) Notice: Subject to any disclaimer, the term of this patent is extended or adjusted under 35 U.S.C. 154(b) by 0 days.

(21) Appl. No.: 15/640,112

(22) Filed: Jun. 30, 2017

(65) Prior Publication Data

US 2017/0302250 A1     Oct. 19, 2017

Related U.S. Application Data

(63) Continuation of application No. PCT/US2016/055796, filed on Oct. 6, 2016.

(60) Provisional application No. 62/238,088, filed on Oct. 6, 2015.

(51) Int. Cl.
| | |
|---|---|
| *H04B 1/10* | (2006.01) |
| *H04B 1/44* | (2006.01) |
| *H03H 9/64* | (2006.01) |
| *H03H 7/38* | (2006.01) |
| *H04B 1/38* | (2015.01) |
| *H03H 11/30* | (2006.01) |
| *H04B 1/04* | (2006.01) |
| *H01Q 1/50* | (2006.01) |
| *H04L 5/14* | (2006.01) |

(52) U.S. Cl.
CPC ............ *H03H 9/64* (2013.01); *H03H 7/38* (2013.01); *H03H 11/30* (2013.01); *H04B 1/0458* (2013.01); *H04B 1/38* (2013.01); *H01Q 1/50* (2013.01); *H04L 5/1461* (2013.01)

(58) Field of Classification Search
CPC . H03H 9/64; H03H 11/30; H04B 1/38; H01Q 1/50; H04L 5/1461; H03F 1/0205; H03F 3/19; H03F 3/21
USPC .................. 327/551–559; 330/284; 333/189; 455/304, 266
See application file for complete search history.

(56) References Cited

U.S. PATENT DOCUMENTS

| | | | |
|---|---|---|---|
| 7,567,782 B2 * | 7/2009 | Liu ............ | H04B 1/0067 455/102 |
| 7,728,696 B2 * | 6/2010 | Stuebing ...... | H03H 9/0014 330/302 |

(Continued)

OTHER PUBLICATIONS

United States Patent Office, International Search Report and Written Opinion for PCT Application No. PCT/US16/55796, dated Dec. 30, 2016.

*Primary Examiner* — Dinh T Le
(74) *Attorney, Agent, or Firm* — SoCal IP Law Group LLP; John E. Gunther

(57) ABSTRACT

A transmit filter for a communications device includes a surface acoustic wave (SAW) band-pass filter configured to pass a transmit frequency band and a tunable transmitter impedance matching network in series. The tunable transmitter impedance matching network matches an input impedance of the SAW band-pass filter to the output impedance of a power amplifier over a portion of the transmit frequency band in response to a tuning input.

11 Claims, 11 Drawing Sheets

(56) References Cited

U.S. PATENT DOCUMENTS

| | | | |
|---|---|---|---|
| 8,041,315 B2 * | 10/2011 | Hamalainen | H03F 1/0205 330/129 |
| 9,391,650 B2 * | 7/2016 | Aparin | H04B 1/18 |
| 9,425,742 B2 * | 8/2016 | Langer | H03F 1/0222 |
| 9,647,631 B2 | 5/2017 | Gaynor | |
| 2012/0169565 A1 | 7/2012 | Morris, III | |
| 2013/0187727 A1 | 7/2013 | Spears et al. | |
| 2015/0091776 A1 | 4/2015 | Gaynor et al. | |
| 2016/0173030 A1 * | 6/2016 | Langer | H01F 1/0222 330/291 |

* cited by examiner

RADIO FREQUENCY TRANSMIT FILTER WITH INTEGRATED IMPEDANCE MATCHING NETWORK

RELATED APPLICATIONS

This patent is a continuation of Patent Application PCT/US16/55796, filed Oct. 6, 2016, titled Radio Frequency Transmit Filter With Integrated Impedance Matching Network, which claims benefit of Provisional Patent Application No. 62/238,088, filed Oct. 6, 2015, titled Radio Frequency Transmit Filter.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using surface acoustic wave (SAW) resonators, such as transmit filters and duplexers for use in communications equipment.

Description of the Related Art

FIG. 1 is a block diagram of portions of a representative communications device 100. The communications device 100 includes a transmitter 110, a duplexer 120, an antenna 140, and a receiver 160. The duplexer 120 includes a transmit filter 130 and a receive filter 150, which is common. The transmit filter 130 is coupled between the transmitter 110 and the antenna 140, as is typical. The receive filter 150 is coupled between the antenna 140 and the receiver 160, as is typical. An important function of the duplexer 120 is to isolate the receiver from the transmitter to ensure the receiver is not overloaded by energy from the transmitter. To this end, the transmit filter 130 is typically designed to pass frequencies in a transmit frequency band and block, or reject, frequencies in a receive frequency band separate from the transmit frequency band. Conversely, the receive filter 150 is typically designed to pass frequencies in the receive frequency band and block frequencies in the transmit frequency band.

The transmitter 110 typically includes a power amplifier (PA) 112 that generates the radio frequency signal to be transmitted and an impedance matching network 114. The impedance matching network 114 is disposed in the output path of the transmitter 110. In some cases, the impedance matching network 114 may be integrated with the power amplifier 112. Typically, the impedance matching network 114 is designed to match the output impedance of the power amplifier 112 to a nominal impedance value, such as 50 ohms. The transmit filter 130 is designed to have an input impedance equal to the same nominal impedance value. 50 ohms was first defined as a standard impedance value for RF components and test equipment in the 1930s as a compromise between power handling capability and loss for air dielectric coaxial cable. 50 ohms is also a convenient impedance value for the impedance of microstrip and strip line waveguides. Most RF test equipment is designed to have source and load impedances of 50 ohms. Specifying 50 ohms output impedance for the transmitter 110 and 50 ohms input impedance for the duplexer 120 facilitates testing these components with standard test equipment. The nominal impedance value at the output of the transmitter 110 and the input of the duplexer may be some value other than 50 ohms.

In any specific application, the transmitter 110 operates within a predefined transmit frequency band which may be, for example, one of the roughly fifty defined frequency bands for LTE (long term evolution) cellular communications systems. The impedance matching network 114 matches the output impedance of the power amplifier 112 to the nominal impedance value, to the extent practical, over the entire selected transmit frequency band. Similarly, a goal of the transmit filter 130 design is to provide the nominal input impedance over the entire selected transmit frequency band. However, the designs of the impedance matching network 114 and the transmit filter 130 are compromises between many requirements. The output impedance of the transmitter 110 and the input impedance of the transmit filter 130 will both deviate from the nominal value over at least some portions of the transmit frequency band. The output impedance of the transmitter 110 and the input impedance of the transmit filter 130 will deviate from the nominal value differently, such that the mismatch between the output impedance of the transmitter 110 and the input impedance of the transmit filter 130 may result in significant insertion loss at some frequencies within the transmit frequency band.

Throughout this description, elements appearing in figures are assigned three-digit reference designators, where the most significant digit is the figure number where the element is first shown and the two least significant digits are specific to the element. An element that is not described in conjunction with a figure may be presumed to have the same characteristics and function as a previously-described element having the same reference designator.

DETAILED DESCRIPTION

Description of Apparatus

Figure 2:
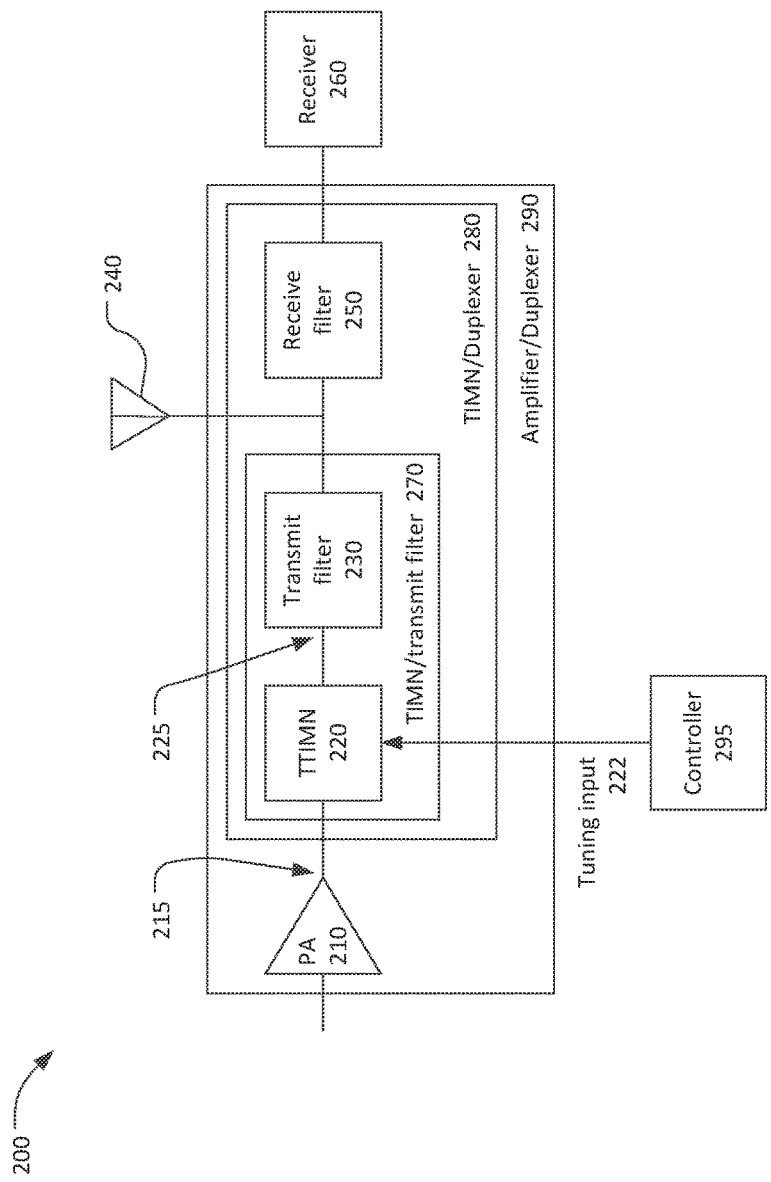
FIG. 2 is block diagram of a communications device including a tunable impedance matching network.

FIG. 2 is a block diagram of portions of a communications device 200 including a power amplifier 210, a tunable transmit impedance matching network (TTIMN) 220, a transmit filter 230, an antenna 240, a receive filter 250, and a receiver 260. The TTIMN 220 is coupled between the power amplifier 210 and an input port of the transmit filter 230. An output port of the transmit filter 230 is connected to the antenna 240. The receive filter 250 is coupled between the antenna 240 and the receiver 250.

Collectively, the TTIMN 220 and transmit filter 230 are required to couple the output of the power amplifier 210 to the antenna 240 with minimum insertion loss while providing high isolation between the power amplifier 210 and the receiver 260. However, the power amplifier 210 does not transmit all of the frequencies in the transmit frequency band simultaneously. Rather, the transmit frequency band is divided into a plurality of transmit frequency channels, and the power amplifier 210 transmits within a single transmit frequency channel at any given time. It is not necessary for the TTIMN 220 and transmit filter 230 to provide low insertion loss for the entire transmit frequency band, but only for the active transmit frequency channel (i.e. the transmit frequency channel actually in use).

Similarly, the receiver 260 does not receive all of the frequencies in the receive frequency band simultaneously. Rather, the receive frequency band is divided into a plurality of receive frequency channels, and the receiver 260 receives within a single receive frequency channel at any given time. Typically, there is a one-to-one correspondence between transmit frequency channels and receive frequency channels with a fixed frequency offset between corresponding transmit and receive frequency channels. At any given time, it is not necessary for the TTIMN 220 and transmit filter 230 to provide high isolation for the entire receive frequency band, but only for the active receive frequency channel (i.e. the receive frequency channel actually in use).

Both an output impedance 215 of the power amplifier 210 and an input impedance 225 of the transmit filter 230 depend on frequency and will change, to at least some extent, between transmit frequency channels. In contrast to the communications device 100, the output impedance 215 of the power amplifier 210 and the input impedance 225 of the transmit filter 230 are not independently matched to a nominal value, such as 50 ohms. Rather, the TTIMN 220 matches the actual output impedance 215 of the power amplifier 210 to the actual input impedance 225 of the transmit filter 230 for the active transmit frequency channel.

The TTIMN 220 receives a tuning input 222. The tuning input 222 may be one or more analog signals, one or more parallel digital signals, a serial digital bit stream, or some other signal or combination of signals. The tuning input 222 may indicate what portion of the transmit frequency band is actually in use. For example, the tuning input 222 may designate a specific active transmit channel, a group of channels containing the active transmit channel, or some other subdivision (e.g. bottom third, middle third, top third) of the transmit frequency band. Alternatively, the tuning input 222 may indicate desired values for one or more variable or switchable components within the TTIMN 220.

The tuning input may be provided by a processor or controller 295 within the communications device 200. This processor or controller may also have responsibility for controlling the transmitter 210 and receiver 260 to transmit on the selected active transmit channel and receive on the selected receive channel, respectively.

The TTIMN 220 includes one or more reactive elements (capacitors and/or inductors) including at least one variable/switchable reactive element. A "variable/switchable reactive element" is an element whose value (capacitance or inductance) can be changed in response to the tuning input 222. The value of the at least one variable/switchable reactive element may be changed, for example, by switching different components in and out of the circuit of the TTIMN 220. Alternatively or additionally, the value of the at least one variable/switchable reactive element may be continuously varied, for example in response to an applied DC voltage or current. At this time, switching different components in and out of the circuit may be the more practical approach. In the future, advances in MEMS (micromechanical-electrical systems) and other component technology may provide suitable continuously variable reactive components.

The tuning input controls the value of the at least one variable/switchable reactive element such that the TTIMN 220 provides an improved impedance match between the power amplifier 210 and the transmit filter 220 for at least a portion of the transmit frequency band. In this context, an "improved impedance match" is an impedance match resulting in lower insertion loss from the power amplifier 210 to the antenna 240 for the active transmit channel compared to the insertion loss of a fixed (non-tunable) impedance matching network, or higher isolation between the transmitter 210 and the received 260 for the active receive channel compared to the isolation of the fixed impedance matching network, or both.

Figure 1:
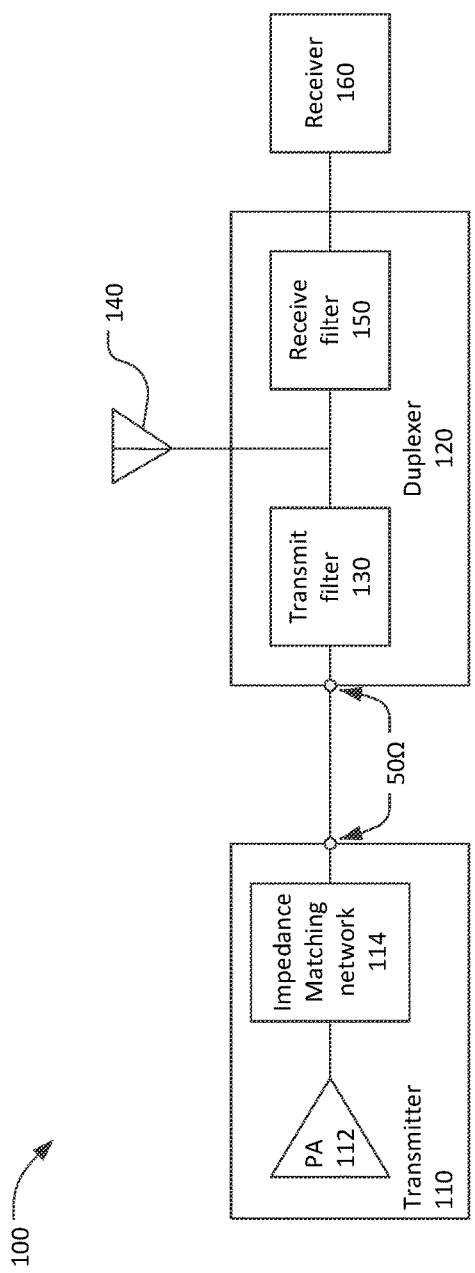
FIG. 1 is a block diagram of a communications device.

In the communications device 100 of FIG. 1, the output impedance of the transmitter 110 and the input impedance of the duplexer 120 are matched to a nominal value such as 50 ohms. This allows the transmitter 110 and the duplexer 120 to be connected by a suitable transmission line, which is to say a transmission line with characteristic impedance equal to or close to the nominal value. In this case, the transmitter 110 and the duplexer 120 need not be located in close proximity since the transmission line can conduct the signal between the devices with minimal loss over a substantial distance.

Returning to FIG. 2, the power amplifier 210, the TTIMN 220, and the transmit filter 230 are preferably located in close proximity, such that these elements can be coupled by short connections rather than transmission lines. In this case, the short connections can be considered components of the TTIMN 220.

The power amplifier 210, the TTIMN 220, and the transmit filter 230 and the receive filter 250 may be integrated within a common package to provide an integrated amplifier/duplexer component 290. For example, the transmit filter 230 and the receive filter 250 may be surface acoustic wave (SAW) bandpass filters fabricated on a common piezoelectric chip or on separate piezoelectric chips. The power amplifier 210 may be a separate integrated circuit chip, and the TTIMN 220 may be fabricated on one or more additional chips. Connections between the chips may be made by means of wire bonds, circuit board traces, or other means. The TTIMN 220 may be fabricated, in whole or in part, on the chip containing the power amplifier 210 or the chip containing the transmit filter 230. The TTIMN 220 may be distributed between two or more chips. The integrated amplifier/duplexer 275 may be packaged in some other manner.

Alternatively, the TTIMN 220, the transmit filter 230, and the receive filter 250 may be integrated within a common package to provide a TIMN/duplexer component 280. In this case the power amplifier 210 is a physically separate component. The TTIMN 220 and the transmit filter 230 may be integrated within a common package to provide an integrated TIMN/transmit filter component 270. In this case the power amplifier 210 and the receive filter 250 may be physically separate components.

Figure 3:
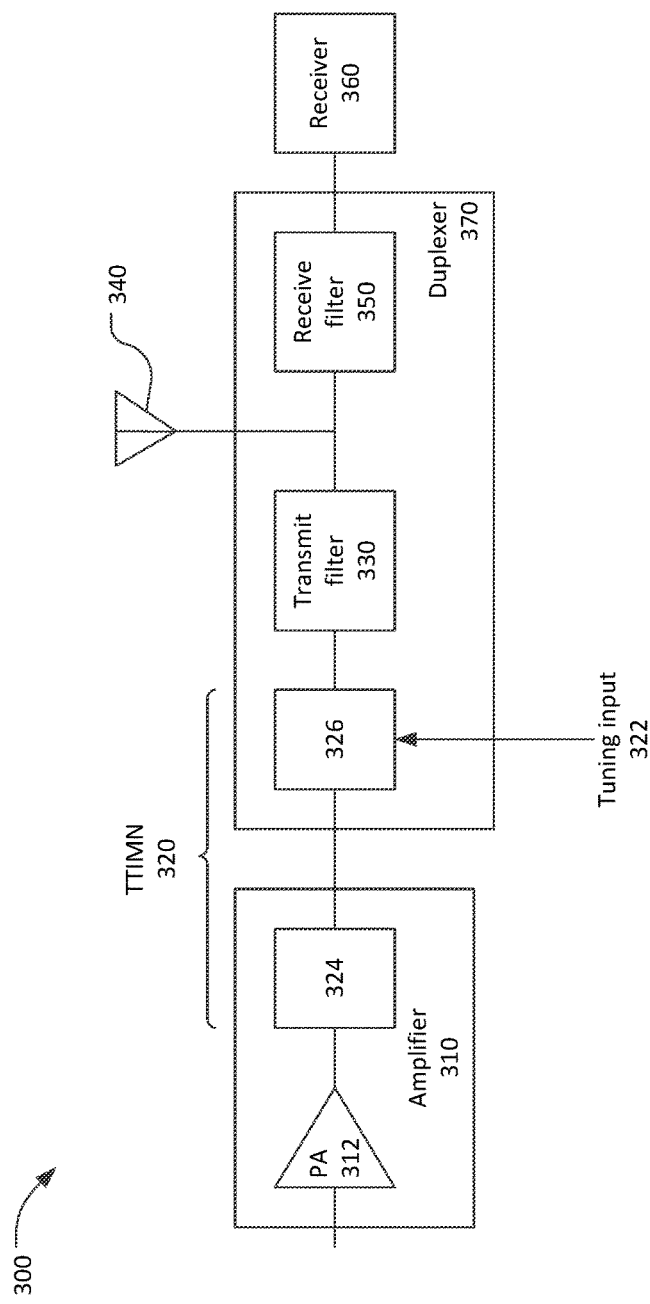
FIG. 3 is block diagram of another communications device including a tunable impedance matching network/duplexer.

FIG. 3 is a block diagram of portions of an exemplary communications device 300 including an amplifier device 310, a duplexer device 370, an antenna 340, and a receiver 360. The amplifier device 310 and the duplexer device 370 are contained in separate packages. The amplifier device 310 includes a power amplifier (PA) 312. The duplexer device 370 includes a transmit filter 330 and a receive filter 350. These elements are comparable to the corresponding elements of the communications devices 100 and 200.

A tunable transmitter impedance matching network (TTIMN) 320 is used to couple the output of the power amplifier 312 to the input of the transmit filter 330. In this example, the TTIMN 320 is distributed between the amplifier device 310 and the duplexer device 370. The amplifier device 310 contains a first portion 324 of the TTIMN 320. The duplexer device 370 contains a second portion 326 of the TTIMN 320. In this example, the first portion 324 includes only fixed reactive components and the second portions 326 contains at least one variable/switchable reactive component controlled by a tuning input 322 as previously described. In other configurations, only the first portion 324 or both the first and second portions 324, 326 of the TTIMN 320 may include variable/switchable reactive components. In these configurations, only the first portion 324 or both the first and second portions 324, 326 of the TTIMN 320 receive the tuning input 322.

Figure 4:
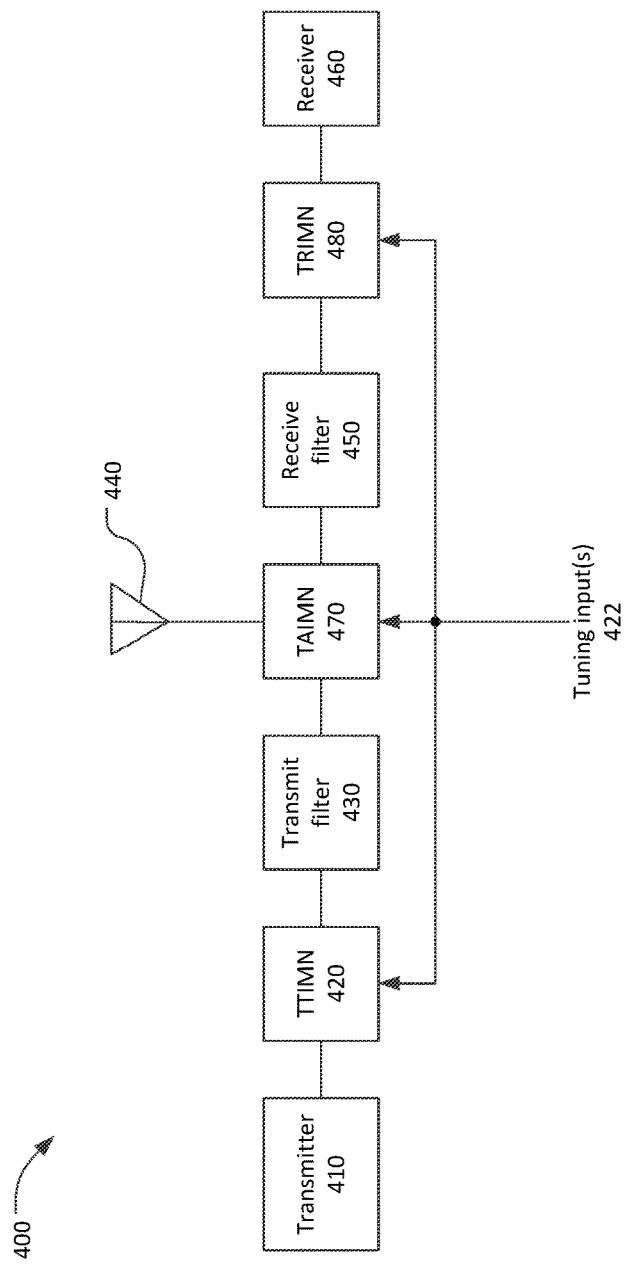
FIG. 4 is a block diagram of another communications device.

Referring now to FIG. 4, a communications device 400 includes a transmitter 410, a transmitter tunable impedance matching network (TTIMN) 420, a transmit filter 430, an antenna 440, a receive filter 450, and a receiver 460. Each of these elements is similar to the counterpart elements of FIG. 1 and FIG. 2. The communications device 400 also includes a tunable antenna impedance matching network (TAIMN) 470 and a tunable receiver impedance matching network (TRIMN) 480.

As previously described, the TTIMN 420 provides an improved impedance match between the transmitter 410 and the transmit filter 430. Similarly, the TRIMN 480 provides an improved impedance match between the receive filter 450 and the receiver 460. In this context, an "improved impedance match" results in lower insertion loss from the antenna 440 to the receiver 460 for at least a portion of the receive frequency band compared to the insertion loss of a fixed impedance matching network, or higher isolation between the transmitter 410 and the receiver 460 for at least a portion of the receive frequency band compared to the isolation of the fixed impedance matching network, or both. The TAIMN 470 provides an improved impedance match between the antenna 440 and the transmit filter 430 and/or the receive filter 450. In this context, an "improved impedance match" results in one or more of lower insertion loss from the transmitter 410 to the antenna 440 for at least a portion of the transmit frequency band, lower insertion loss from the antenna 440 to the receiver 460 for at least a portion of the receive frequency band, or higher isolation between the transmitter 410 and the receiver 460 for at least a portion of the receive frequency band, all compared to the performance of a comparable communications device with fixed impedance matching networks.

Each of the TTIMN 420, the TAIMN 470, and the TRIMN 480 includes at least one variable/switchable reactive component controlled by a tuning input or inputs 422. The tuning inputs 422 may be provided by a processor or controller (not shown) within the communications device 400. This processor or controller may also have responsibility for controlling the transmitter 410 and receiver 460 to transmit on the selected active transmit channel and receive on the selected receive channel, respectively. Each of the TTIMN 420, the TAIMN 470, and the TRIMN 480 the same or different tuning inputs. Each tuning input 422 may be an analog signal, one or more parallel digital signals, a serial digital bit stream, or some other signal. Each tuning input 422 may indicate desired values for variable/switchable reactive elements within the tunable impedance matching networks. Each tuning input 422 may indicate the active portion of the transmit frequency band and/or the receive frequency band. For example, each tuning input 422 may designate a specific active transmit channel, a group of channels containing the active transmit channel, or some other subdivision (e.g. bottom third, middle third, top third) of the transmit frequency band.

A communications device may include one, any two, or all three of the TTIMN 420, the TAIMN 470, and the TRIMN 480.

Figure 5:
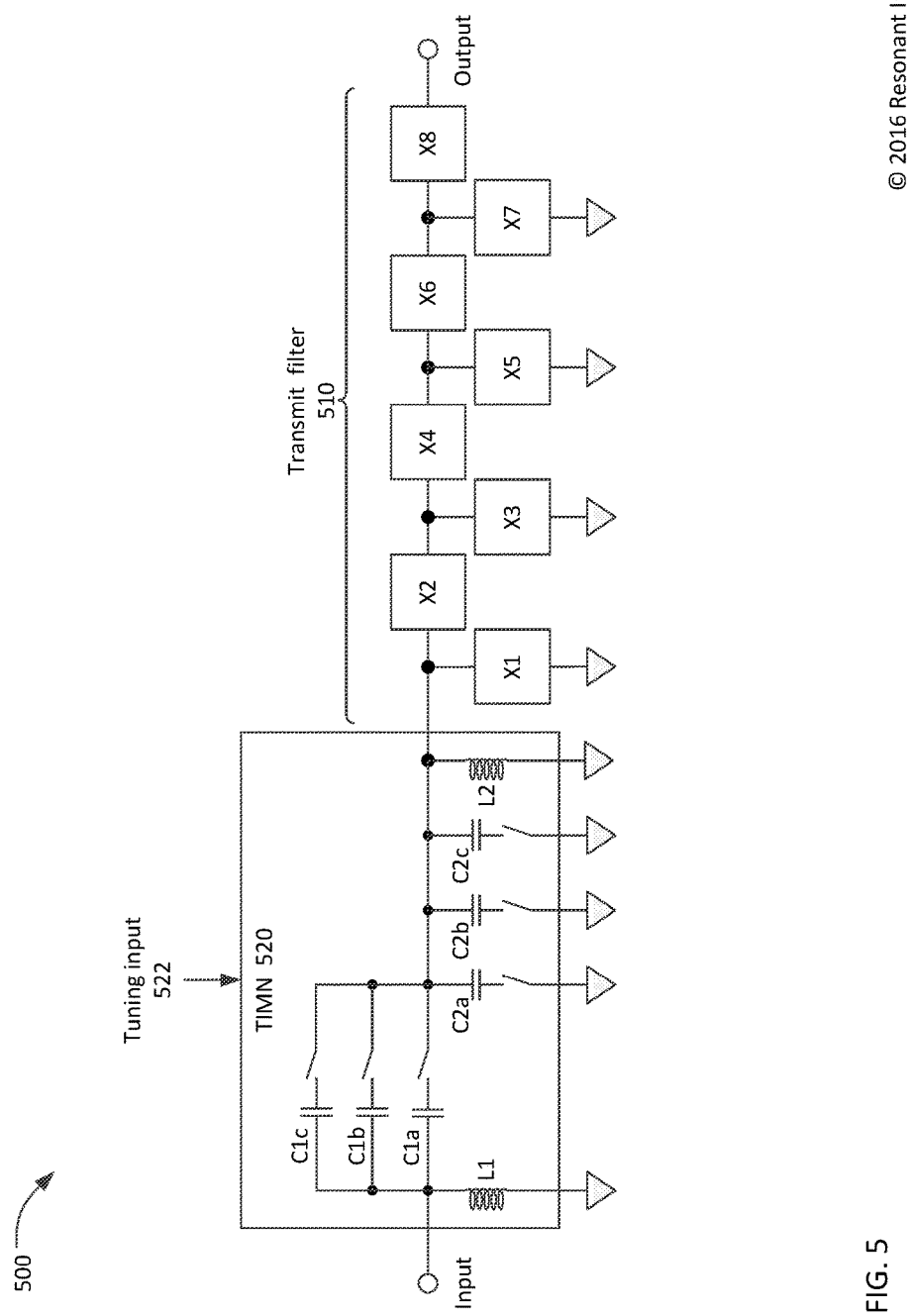
FIG. 5 is a schematic diagram of an exemplary tunable impedance matching network and transmit filter.

FIG. 5 is a schematic diagram of an exemplary integrated tunable impedance matching network/transmit filter (TIMN/TF) 500 which may be suitable for use as the TTIMN 220 and transmit filter 230 of FIG. 2 or the TTIMN 420 and transmit filter 430 of FIG. 4. The integrated tunable impedance matching network/transmit filter 500 includes a tunable impedance matching network (TIMN) 520 and a transmit filter 510 connected in series between an input (typically connected to a transmitter) and an output (typically connected to an antenna).

The transmit filter 510 is an acoustic wave band-pass filter including eight resonators, labeled X1 through X8. The transmit filter 510 includes four series resonators (X2, X4, X6, and X8) connected in series between the tunable impedance matching network and the output. The transmit filter 510 includes four shunt resonators (X1, X3, X5, and X7) connected between junctions of adjacent series resonators and ground. The use of eight resonators, four series resonators, and four shunt resonators is exemplary. A transmit filter may include more or fewer than eight resonators and a different arrangement of series and shut resonators.

Each of the eight resonators X1-X8 may be, for example, surface acoustic wave resonators. The eight resonators X1-X8 may be one or more of surface acoustic wave resonators, bulk acoustic wave resonators, or some other type of resonator. Each of the eight resonators X1-X8 may have a corresponding resonant frequency, f1-f8. The resonant frequencies f1-f8 may all be different. The resonant frequencies of some of the resonators X1-X8 may be the same. Typically, the resonant frequencies f1, f3, f5, f7 of the shut resonators is offset from the resonant frequencies f2, f4, f6, f8 of the series resonators.

The tunable impedance matching network 520 includes two fixed inductors L1, L2, a first switchable capacitor, and a second switchable capacitor. The first switchable capacitor includes three capacitor elements C1a, C1b, C1c in series with respective switches that may be opened or closed to disconnect or connect the corresponding capacitor element from the impedance matching network. Similarly, the second switchable capacitor includes three capacitor elements C2a, C2b, C2c in series with respective switches that may be opened or closed to disconnect or connect the corresponding capacitor element from the impedance matching network. These switches can be controlled by the tuning input to set appropriate values for the first and second switchable capacitors to provide an impedance match between an amplifier device connected to the input and the transmit filter 510.

The fixed inductors L1, L2, and the first and second switchable capacitors may be implemented using discrete or chip component elements mounted on a suitable circuit board and interconnected by wire bonds, printed traces, or other means. The fixed inductors L1, L2, and the first and second switchable capacitors may be implemented, in part, by elements printed on the circuit board. The capacitor elements and switches within the first and second switchable capacitors may be discrete components or elements of a common integrated circuit chip. One or both of the first and second switchable capacitors may be, for example, an integrated digitally tunable capacitor such as those produced by Peregrine Semiconductor.

The impedance matching network 520 is exemplary. Depending on the impedances (i.e. the output impedance of the amplifier and the input impedance of the transmit filter) to be matched, an impedance matching network may have a different circuit configuration including more or fewer than four reactive components and more or fewer than two switchable/variable reactive components. Switchable capacitors, if used, may have more or fewer than three capacitor elements in series with respective switches.

Figure 6:
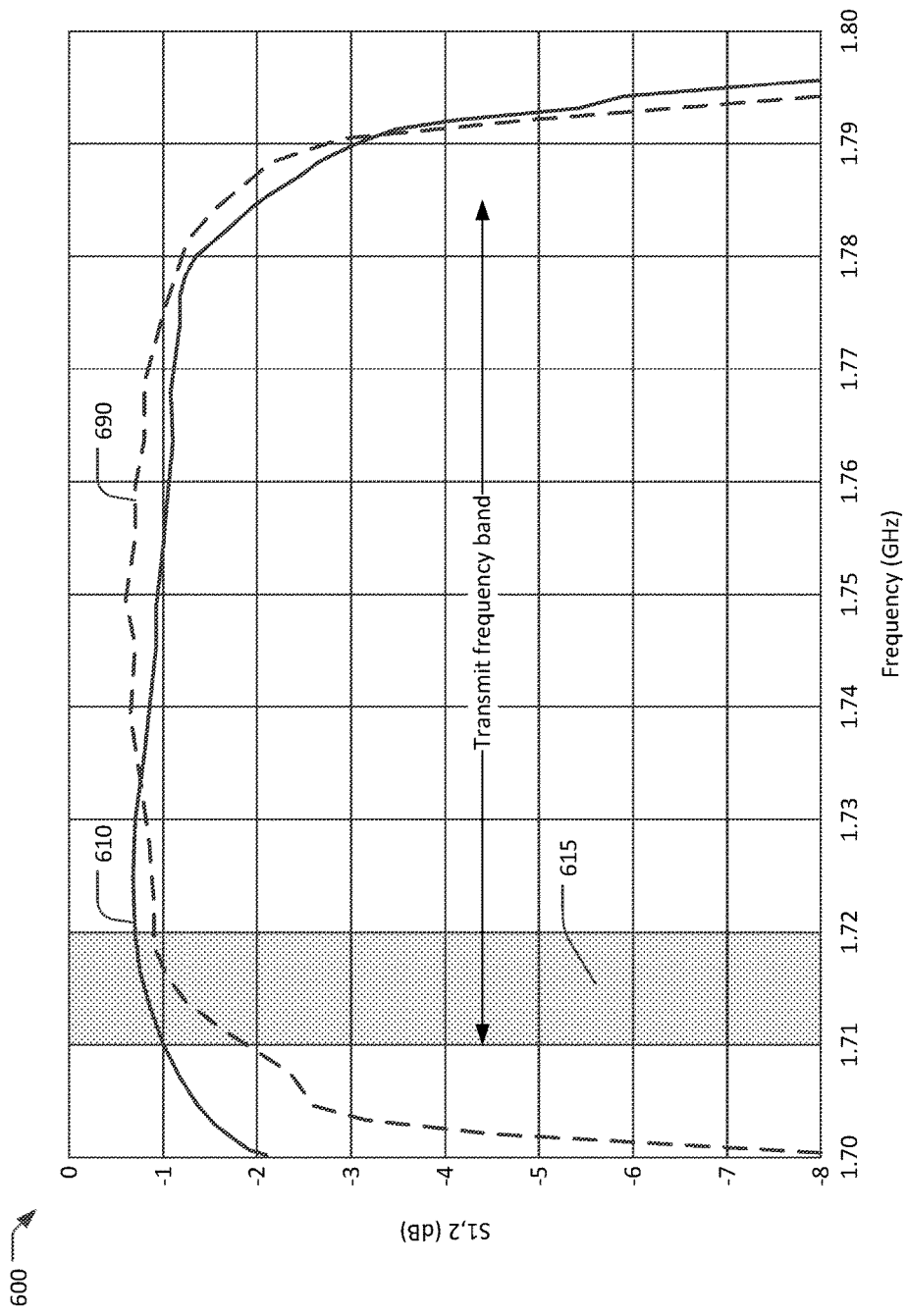
FIG. 6 is a graph of the transmission of an integrated tunable impedance matching network/transmit filter for a first frequency channel.

FIG. 6 shows a graph 600 plotting the S(1,2) parameter of the exemplary TIMN/TF 500. S-parameters, or scattering parameters, are a convention used to describe the performance of linear electrical networks. S(1,2) is the transfer function from port 1 to port 2 of an electrical network. S(1,2) is essentially the "insertion loss" of the filter with a change in numeric sign (e.g. S(1,2)=−3 dB is equivalent to an insertion loss of 3 dB). The tunable impedance matching network/transmit filter 500 is designed for the UMTS (Universal Mobile Telecommunications System) Band 3. The corresponding transmit frequency band extends from 1710 MHz to 1785 MHz. This transmit frequency band is commonly divided into seven frequency channels having 10 MHz bandwidth. The corresponding receive frequency band extends from 1805 MHz to 1880 MHz. This receive frequency band is also divided into seven frequency channels, with an offset of 95 MHz between each receive frequency channel and the corresponding transmit frequency channel.

In FIG. 6, the solid line 610 is a plot of the input-to-output transfer function versus frequency for the TIMN/TF 500 when the amplifier driving the TIMN/TF 500 is operating in the lowest frequency channel within the UMTS Band 3 transmit frequency band, indicated by the shaded area 615. The dashed line 690 is a plot of the input-to-output transfer function of a reference communications device including the transmit filter 530 and a fixed impedance matching network designed to provide constant performance (to the extent possible) over the transmit frequency band with a fixed input impedance of 50 ohms. Note that the TIMN/TF 500 (solid line 610) provides about 1 dB higher throughput than the reference filter (dashed line 690) at the lower edge of the active transmit channel (shaded area 615).

Figure 7:
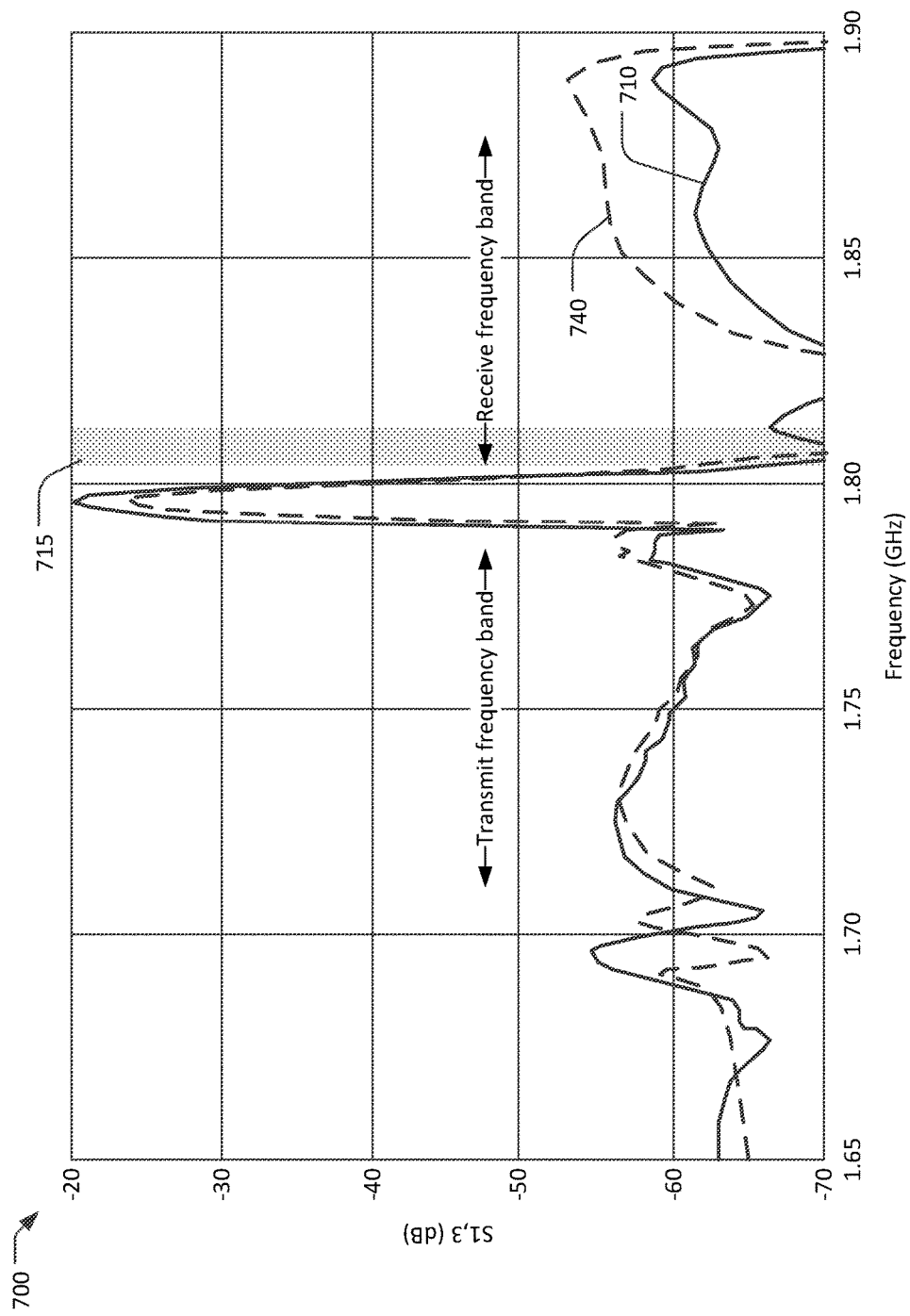
FIG. 7 is a graph of the transmit port to receive port isolation of an integrated tunable impedance matching network/duplexer for a first frequency channel.

FIG. 7 shows a graph 700 plotting the S(1,3) parameter versus frequency for an integrated TIMN/duplexer and a reference communications device. S(1,3) is the transfer function from the transmitter port (port 1) to the receiver port (port 3) of an integrated TIMN/duplexer. S(1,3) is essentially the "isolation" of the duplexer with a change in numeric sign (e.g. S(1,2)=−50 dB is equivalent to an isolation of 50 dB).

In FIG. 7, the shaded area 715 identifies the receive frequency channel corresponding to the transmit frequency channel 615 identified in FIG. 6. The solid line 710 is a plot of S(1,3) for an integrated TIMN/duplexer including the TIMN/TF 500 and a typical receive filter. Specifically, the solid line 710 is a plot of S(1,3) for the improved duplexer when the amplifier driving the transmit filter is operating in the lowest transmit frequency channel. The dashed line 740 is a plot of S(1,3) for a reference communications device including the same transmit and received filters and the fixed impedance matching network. The isolation provided by the integrated TIMN/duplexer and the reference communications device are about the same for the active receive frequency channel (shaded area 715).

Figure 8:
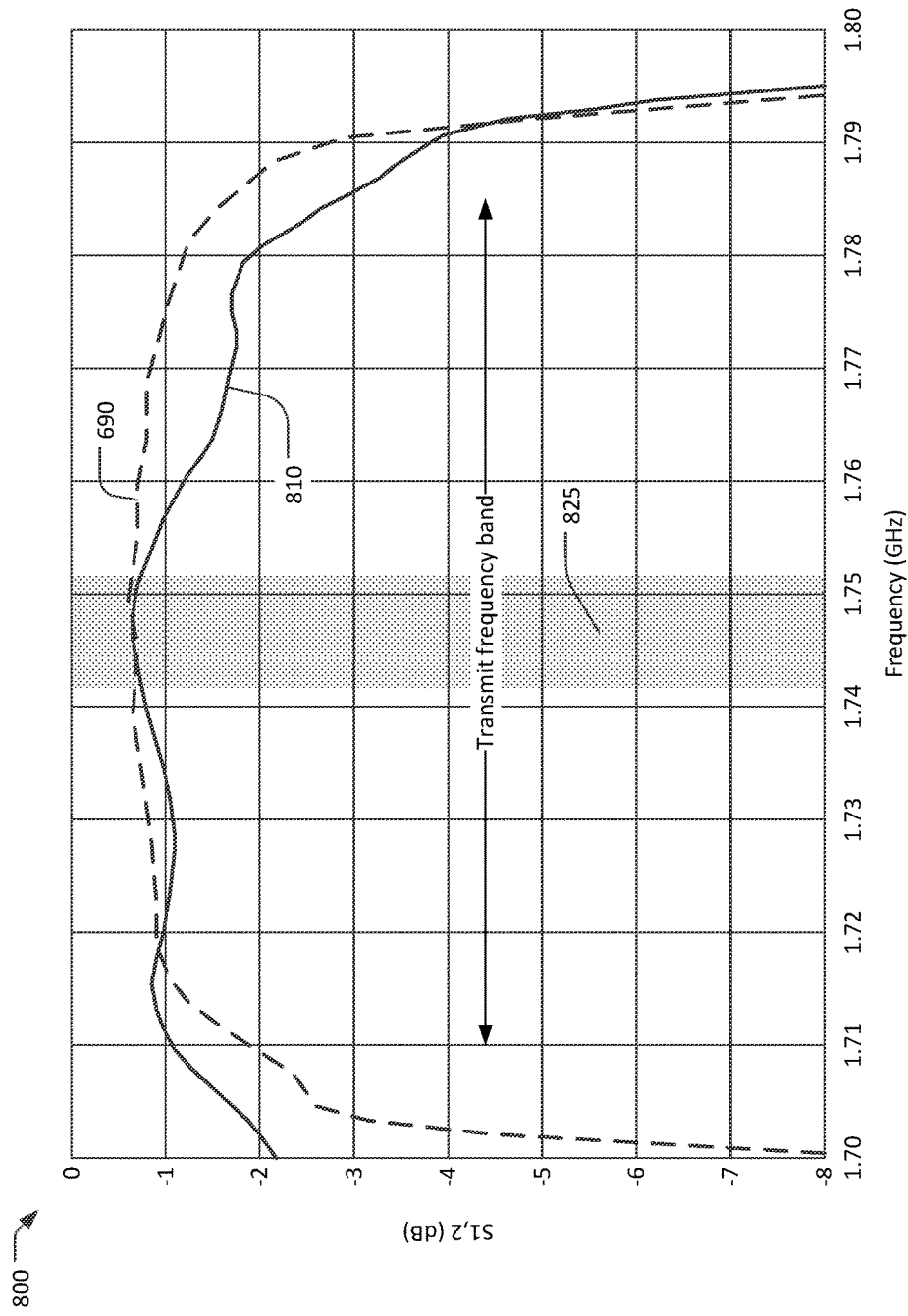
FIG. 8 is a graph of the transmission of an integrated tunable impedance matching network/transmit filter for a second frequency channel.

FIG. 8 shows another graph 800 plotting the S(1,2) parameter versus frequency for the TIMN/TF 500. The solid line 810 is a plot of the input-to-output transfer function of the TIMN/TF 500 when the amplifier driving the TIMN/TF 500 is operating in the center frequency channel within the UMTS Band 3 transmit frequency band, indicated by the shaded area 825. The dashed line 690 (previously shown in FIG. 6) is a plot of the input-to-output transfer function of the reference communications device. Note that the TIMN/TF 500 (solid line 510) provides equivalent throughput to the reference filter (dashed line 690) for the active channel (shaded area 515).

Figure 9:
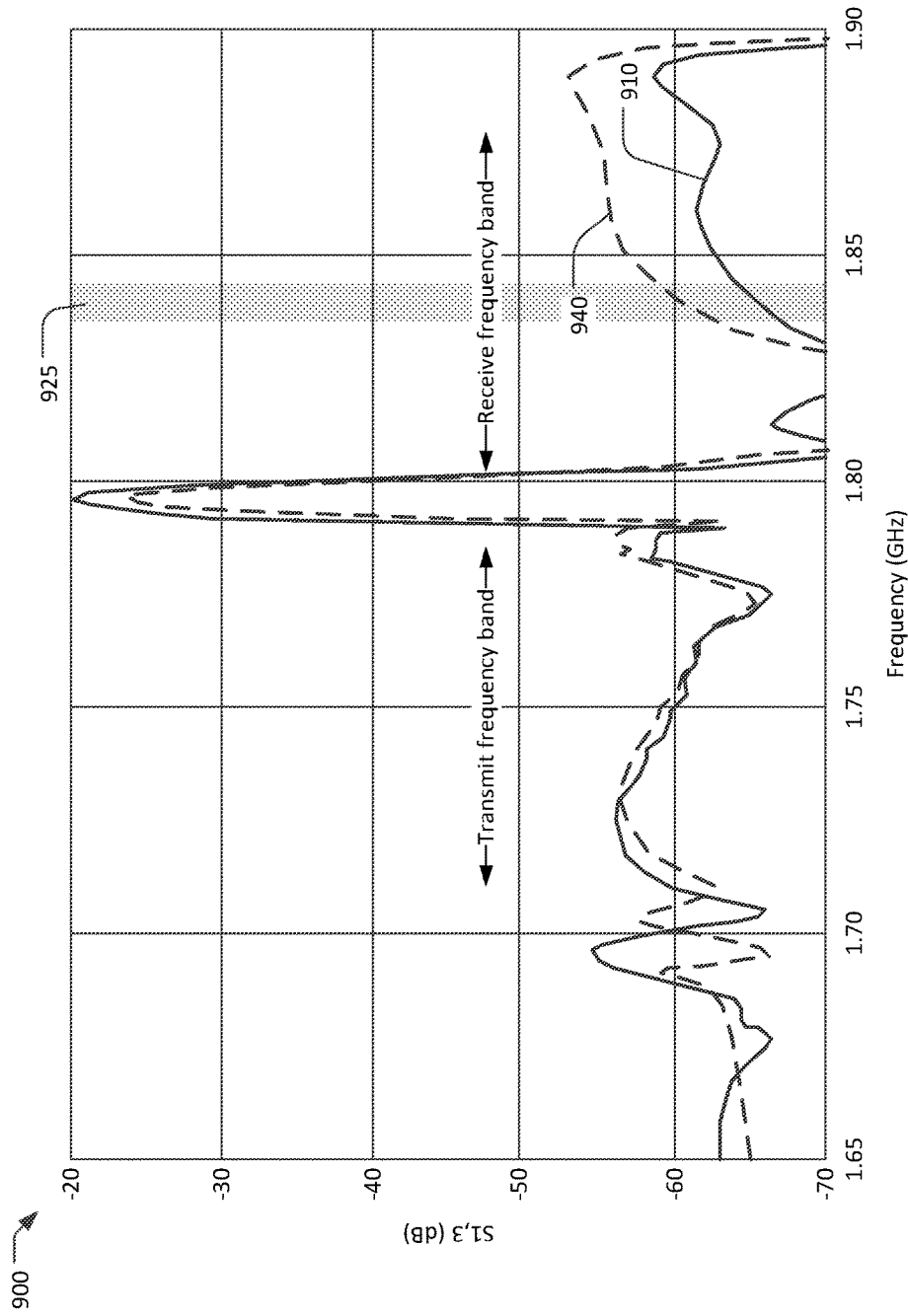
FIG. 9 is a graph of the transmit port to receive port isolation of an integrated tunable impedance matching network/duplexer for a second frequency channel.

FIG. 9 shows another graph 900 plotting the S(1,3) parameter versus frequency for an the integrated TIMN/duplexer and the reference communications device. In FIG. 9, the shaded area 925 identifies the receive frequency channel corresponding to the transmit frequency channel 825 identified in FIG. 8. The solid line 910 is a plot of S(1,3) for the integrated TIMN/duplexer when the amplifier driving the transmit filter is operating in the center transmit frequency channel. The dashed line 940 is a plot of S(1,3) for the reference communications device including the same transmit and received filters and the fixed impedance matching network. The isolation provided by the integrated TIMN/duplexer is about 7.5 dB higher than the isolation provided by the reference communications device for the active receive frequency channel (shaded area 925).

Figure 10:
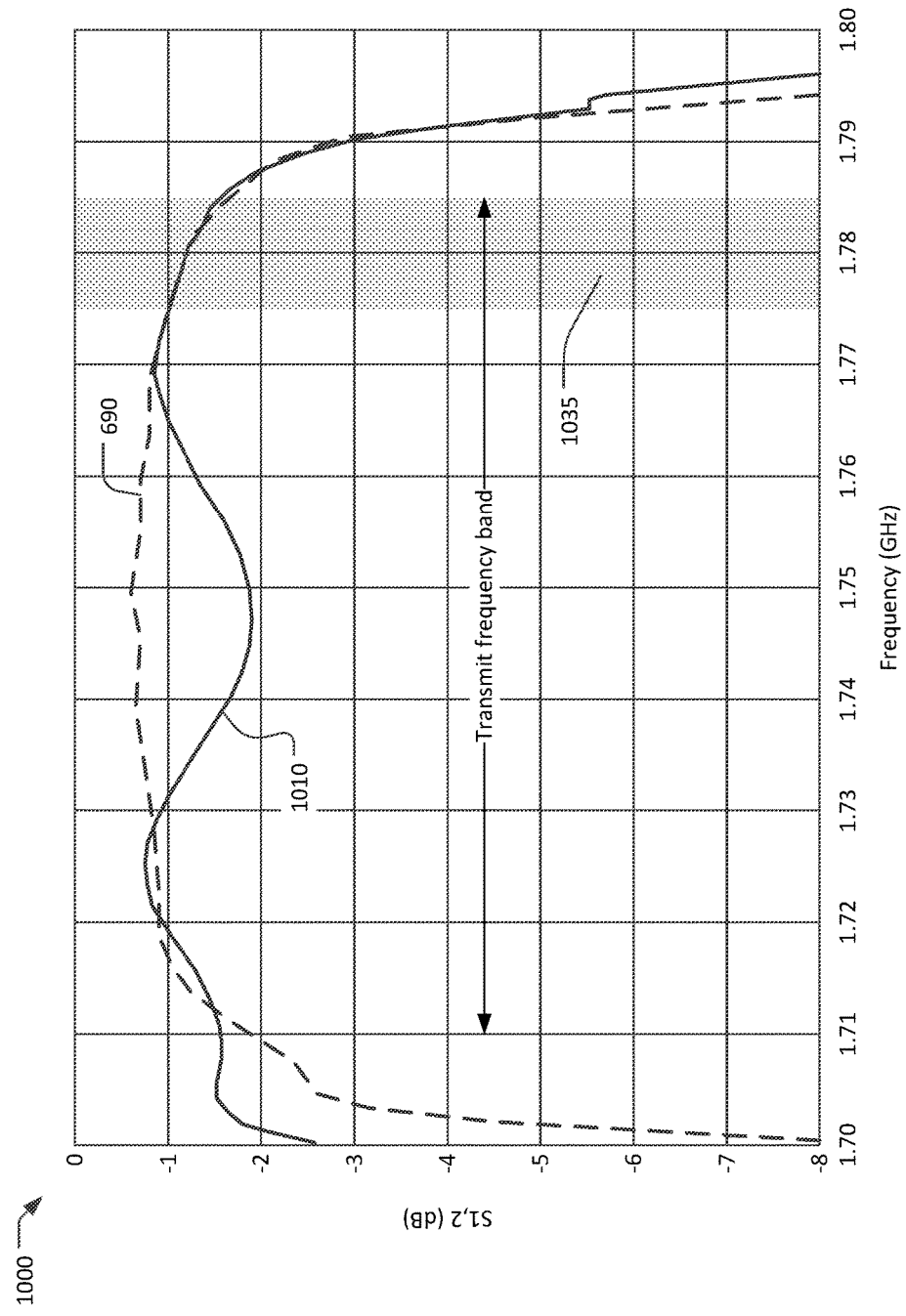
FIG. 10 is a graph of the transmission of an integrated tunable impedance matching network/transmit filter for a third frequency channel.

FIG. 10 shows a third graph 1000 plotting the S(1,2) parameter versus frequency for the TIMN/TF 500. The solid line 1010 is a plot of the input-to-output transfer function of the TIMN/TF 500 when the amplifier driving the TIMN/TF 500 is operating in the highest frequency channel within the UMTS Band 3 transmit frequency band, indicated by the shaded area 1015. The dashed line 990 (previously shown in FIG. 9 and FIG. 8) is a plot of the input-to-output transfer function of the reference communications device. Note that the TIMN/TF 500 (solid line 1010) provides equivalent throughput to the reference filter (dashed line 690) for the active channel (shaded area 1035).

Figure 11:
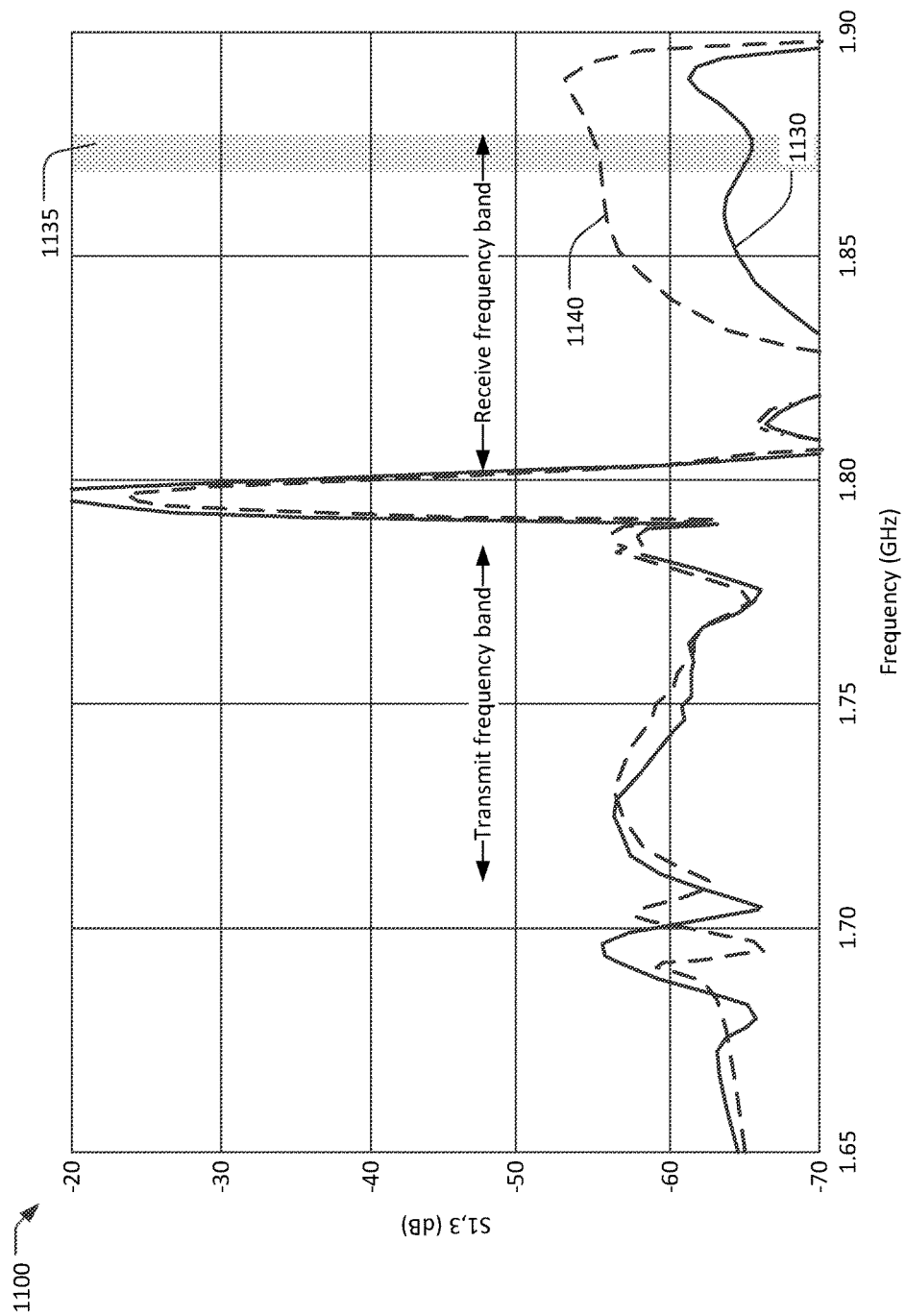
FIG. 11 is a graph of the transmit port to receive port isolation of an integrated tunable impedance matching network/duplexer for a third frequency channel.

FIG. 11 shows another graph 1100 plotting the S(1,3) parameter versus frequency for an the integrated TIMN/duplexer and the reference communications device. In FIG. 11, the shaded area 1135 identifies the receive frequency channel corresponding to the transmit frequency channel 1035 identified in FIG. 10. The solid line 1110 is a plot of S(1,3) for the integrated TIMN/duplexer when the amplifier driving the transmit filter is operating in the highest transmit frequency channel. The dashed line 1140 is a plot of S(1,3)

for the reference communications device including the same transmit and received filters and the fixed impedance matching network. The isolation provided by the integrated TIMN/duplexer is about 10 dB higher than the isolation provided by the reference communications device for the active receive frequency channel (shaded area 1135).

The plots 610 through 1110 (shown in FIG. 6 through FIG. 11, respectively) are results of simulations using circuit models for the acoustic resonators within the transmit filter and the receive filter. These results show that, for this particular example, the use of a tunable impedance matching network between the power amplifier and the transmit filter provides reduced insertion loss and increased isolation over different portions of the transmit frequency band. It is expected that the incorporation of a tunable antenna impedance matching network and/or a tunable receiver impedance matching network would provide similar performance improvements.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A communications device, comprising:
a transmitter comprising a power amplifier;
a transmit filter configured to pass frequencies within a transmit frequency band and reject frequencies within a corresponding receive frequency band;
a tunable transmitter impedance matching network coupled between an output of the power amplifier and an input of the transmit filter;
a receive filter configured to pass frequencies within the receive frequency band and reject frequencies within the transmit frequency band, an input of the receive filter connected to an output of the transmit filter;
a tunable receiver impedance matching network coupled between an output of the receive filter and a receiver port for connection to a receiver; and
a controller that controls the transmitter to transmit on a selected transmit frequency channel of a plurality of transmit frequency channels within the transmit frequency band and provides a first tuning input to the tunable transmitter impedance matching network and a second tuning input to the tunable receiver impedance matching network, wherein
the first tuning input tunes the tunable transmitter impedance matching network to match an input impedance of the transmit filter to an output impedance of the power amplifier at the selected transmit frequency channel.

2. The communications device of claim 1, wherein the first tuning input comprises one or more of an analog signal, a digital signal, and a digital bit stream.

3. The communications device of claim 1, wherein the transmit filter and the tunable transmitter impedance matching network in series have lower insertion loss from the output of the power amplifier to an output of the transmit filter for at least some of the plurality of transmit frequency channels when compared to the transmit filter and a non-tunable impedance matching network in series.

4. The communications device of claim 1, wherein
the output of the transmit filter and the input of the receive filter are coupled to an antenna port for connection to an antenna.

5. The communications device of claim 4, wherein:
the output of the transmit filter and the input of the receive filter are coupled to the antenna port through a tunable antenna impedance matching network, and
the controller provides a third tuning input to the tunable antenna impedance matching network.

6. The communications device of claim 1, wherein the the transmit filter, the receive filter, and the tunable transmitter impedance matching network in series provide improved isolation from the output of the power amplifier to an output of the receive filter for at least some of a plurality of receive frequency channels when compared to the transmit filter, the receive filter, and a non-tunable impedance matching network in series.

7. A communications device, comprising:
a transmitter comprising a power amplifier;
a transmit filter configured to pass frequencies within a transmit frequency band and reject frequencies within a corresponding receive frequency band;
a tunable transmitter impedance matching network coupled between an output of the power amplifier and an input of the transmit filter;
a receive filter configured to pass frequencies within the receive frequency band and reject frequencies within the transmit frequency band, an input of the receive filter connected to an output of the transmit filter;
a tunable antenna impedance matching network coupled between the output of the transmit filter and the input of the receive filter and an antenna port for connection of an antenna, and
a controller that controls the transmitter to transmit on a selected transmit frequency channel within the transmit frequency band and provides a first tuning input to the tunable transmitter impedance matching and a second tuning input to the tunable antenna impedance matching network, wherein
the first tuning input tunes the tunable transmitter impedance matching network to match an input impedance of the transmit filter to an output impedance of the power amplifier at the selected transmit frequency channel.

8. The communications device of claim 7, wherein the first tuning input comprises one or more of an analog signal, a digital signal, and a digital bit stream.

9. The communications device of claim 7, wherein the transmit filter and the tunable transmitter impedance matching network in series have lower insertion loss from the output of the power amplifier to an output of the transmit filter for at least some of the plurality of transmit frequency channels when compared to the transmit filter and a non-tunable impedance matching network in series.

10. The communications device of claim 7, wherein the transmit filter, the receive filter, and the tunable transmitter impedance matching network in series provide improved isolation from the output of the power amplifier to an output of the receive filter for at least some of a plurality of receive frequency channels when compared to the transmit filter, the receive filter, and a non-tunable impedance matching network in series.

11. The communications device of claim 7, further comprising:
   a tunable antenna receiver matching network coupled between an output of the receive filter and a receive port for connection of a receiver, wherein
   the controller provides a third tuning input to the tunable receiver impedance matching network.

* * * * *